(12) United States Patent  (10) Patent No.: US 7,161,658 B2
Franken  (45) Date of Patent: Jan. 9, 2007

(54) LITHOGRAPHIC APPARATUS AND DEVICE MANUFACTURING METHOD

(75) Inventor: Dominicus Jacobus Petrus Adrianus Franken, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 38 days.

(21) Appl. No.: 10/932,318

(22) Filed: Sep. 2, 2004

(65) Prior Publication Data

US 2005/0083500 A1    Apr. 21, 2005

(51) Int. Cl.
G03B 27/42    (2006.01)

(52) U.S. Cl. ......................................................... 355/53
(58) Field of Classification Search ...................... None
See application file for complete search history.

(56) References Cited

U.S. PATENT DOCUMENTS

| 6,441,884 | B1* | 8/2002 | Takahashi et al. | 355/53 |
| 6,549,270 | B1* | 4/2003 | Ota | 355/55 |
| 6,614,503 | B1* | 9/2003 | Uzawa | 355/30 |
| 2003/0117600 | A1* | 6/2003 | Taniuchi et al. | 355/53 |
| 2004/0051984 | A1* | 3/2004 | Oshino et al. | 359/845 |

FOREIGN PATENT DOCUMENTS

| EP | 1 278 089 A2 | 1/2003 |
| EP | 0 321 823 A2 | 6/2003 |
| EP | 1 321 822 A1 | 6/2003 |
| EP | 1 278 089 A3 | 2/2004 |
| KR | 2003-0035813 | 5/2003 |

* cited by examiner

Primary Examiner—D. Rutledge
(74) Attorney, Agent, or Firm—Pillsbury Winthrop Shaw Pittman LLP

(57) ABSTRACT

A lithographic apparatus is disclosed. The apparatus includes a projection optics assembly for projecting a patterned beam of radiation onto a target portion of a substrate. The assembly includes a plurality of movable optical elements and a plurality of sensor units for sensing a position and/or orientation of a respective optical element. The movable optical elements are arranged in a spaced relationship on a support frame. The support frame is at least partly formed by an assembly of at least two interconnected segments. Each of the segments movably mount at least one of the optical elements and fixedly mount at least one of the sensor units. The support frame serves as a reference and mounting frame within which the optical elements are mounted in the spaced relationship.

17 Claims, 6 Drawing Sheets

LITHOGRAPHIC APPARATUS AND DEVICE MANUFACTURING METHOD

CROSS-REFERENCE TO RELATED APPLICATIONS

This application claims the benefit of priority from European Patent Application No. 03077785.8, filed Sep. 4, 2003, the entire content of which is incorporated herein by reference.

FIELD

The present invention relates to a lithographic apparatus and a device manufacturing method.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g. including part of, one, or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti-parallel to this direction.

A projection optics assembly that includes a support frame is known. Conventionally, the projection optics assembly includes a reference frame and a plurality of sensor frames which are mounted in the reference frame. The sensor frame is a frame adapted to support among other components, an optical element, typically a moveable mirror, one or more sensor units for sensing the position of the optical element, and one or more actuators, which is responsive to the sensor unit, for moving the optical element to a desired position. A separate sensor frame is provided for each mirror. Such a sub-assembly is conventionally referred to as a "mirror module". Conventionally, the approach to designing a support frame is to provide a plurality of mirror modules. The exact number will depend on the particular projection optics assembly. Typically, however, the projection optics assembly includes 6 mirrors. Each mirror module includes a sensor frame that contains all of the necessary components to have a fully functional adjustable mirror. Each of these mirror modules are then mounted into a common reference frame, typically made of a low expansion glass material, such as ZERODUR®. Typically, one of the mirrors in the projection optics assembly is stationary. In conventional systems, this stationary mirror is also mounted on the common reference frame.

Such conventional arrangements have problems. First, in order to mount the components on the sensor frame, a large number of optical spacers are required. In particular, a large number of spacers are necessary to mount a sensing element, which senses the position of the mirror. The use of spacers in the arrangement is expensive, in particular, in terms of the man hours required to mount the spacers in the sensor frame.

Second, it has been found that attaining accurate positioning after mounting the mirror modules in the reference frame can only be achieved using yet further spacers, which adds further to the manufacturing costs and time scales of the support frame.

Third, the mirror modules are mounted into the reference frame using a so-called "statically determined interface". Such an interface includes elements whose functionality may be compared with a flexible rod, since the interface element is designed to be stiff in one direction, and as compliant as possible in the other five directions. The interface elements are complex constructions, each including a number of parts. Typically an interface element connects two ZERODUR® parts of the support frame construction. For example, one side of the interface element connects with the reference frame, and at the other side, the interface element connects with the sensor frame. The interface elements are attached to respective ZERODUR® frame parts. The attachments are metal inserts. These inserts are glued into the ZERODUR®. In an attempt to minimize thermal problems caused by the inserts, they have a particular design. It has been found that, in spite of the design of the inserts, the fact that metal inserts need to be glued into the two ZERODUR® frame parts to be connected increases the thermal stability problem.

Furthermore, the interface element should allow for manufacturing tolerances of holes formed in the interface elements in order to connect them to the frame. This results in a misalignment, both in position and angle of the two inserts glued into the two parts to be connected. Conventional interface elements should, therefore, also include an element to allow and compensate for this. Also, since the insert is of a metal material, its thermal expansion in a longitudinal direction is non-zero. This longitudinal direction is the stiff direction, that is, the direction that determines the position of the module relative to the reference structure. This position should ideally remain as constant as possible with changing temperature, and should also be compensated for internally. A conventional interface also includes an element to lock the interface element into place once the mirror module is positioned. From the above discussion, it will be understood that the conventionally required interface is highly complex in terms of design and implementation.

A "statically determined interface" is one in which the interface is made such that only six degrees of freedom (DOFs) of a module are constrained (no more and no less). This means that the module is mounted in six degrees of freedom to its environment. In an ideal case, this means that if the environment distorts, for example, due to thermal effects, the suspended module will only displace and/or rotate as a whole, but it will not distort. The less statically determined an interface becomes, due to parasitical stiffnesses, the more distortion of the environment, in this case the reference structure, which may cause internal distortion of the module itself. This is unwanted.

One way of creating a conventional statically determined interface is to design six identical interface elements, which approximate the functionality of a flexible rod as near as possible. These six interface elements should be positioned and oriented in such a way that they are capable of constraining six degrees of freedom of the module, but not less. As discussed previously, however, this is a highly complex design.

For some time, it has been the conventional thinking, in view of the manufacturability, reliability and testability demands, required in a projection optics assembly, to provide a modular design. Inextricably linked with a conventional modular design is the interfacing of these modules. As discussed, the interfacing of parts of a construction with high dynamic demands, such as those required in a projection optics assembly, is with precision mechanics. Thus, it is conventional to provide projection optics assemblies having a modular design and using complex interfaces to interface modules. Ideally, each module is a fully functional, fully tested unit. Therefore, mounting a module onto its appropriate interface should not distort or influence the fully tested unit in any way, both in the short term, during the mounting itself, or in the long term. As discussed, "statically determined interfacing" is one approach. It has been found that one drawback of conventional "statically determined interfacing" is dynamic behavior. Demands associated with the dynamic behavior of a construction are associated with, and derived from its required performance specifications in terms of, for example, positional accuracy, which is derived from specifications regarding optical performance, related to image position and quality.

With respect to conventional arrangements, it has been found that it is no longer possible to design a sensor frame with statically determined interfaces that meet the dynamic demands of the projection optics assembly, within the volume available in the support frame, while leaving room for assembly, access and cabling, among other things, and while minimizing internal distortion.

Further, in modern projection optics assemblies, a first moveable mirror is to be positioned with respect to a second mirror with sub-nanometre accuracy. It is understood that in the conventional system described above, in order to do this, five distances should be accurately known: the distance between the first sensor unit and the first sensor frame, the first sensor frame and the reference frame associated with the first mirror module, the reference frame associated with the first mirror module and the reference frame associated with the second mirror module, the reference frame associated with the second mirror module and the second sensor frame, and the second sensor frame and the second sensor unit. Further problems associated with this arrangement are manufacturing tolerances and position accuracy, since dynamic behavior is associated with interface constructions. It is understood that in order to go from one sensor on one sensor frame to another sensor on another sensor frame, eight mounting positions and four interface constructions should be passed through. Further, as mentioned, each construction part has its own internal inaccuracies. Also, each interface position has its own inaccuracies. So, therefore, the more construction parts, and the more interface positions there are, the smaller the inaccuracy value that is acceptable from each individual error contribution, in order to attain one constant acceptable value associated with the position of one sensor on one sensor frame with respect to another on another sensor frame. This latter value is the total value from all contributors. This value is a functional requirement, as it is derived from functional specifications. The more parts, the more contributors, the smaller the values from each individual contributor may be in order to attain a constant sum, to meet the functional requirements.

It has been found that conventional projection optics assemblies, even those constructed of glasses with low expansion coefficient, such as ZERODUR®, and constructed in such a manner to maximize their rigidity, the errors associated with each of the five distances accumulate to make it difficult to meet the initial sensor position accuracy of the projection optics assembly. This leads to a limited imaging quality.

SUMMARY

Broadly speaking, one aspect of the present invention is to provide a module interface that takes into account aspects, such as distortion, both during and after mounting, meeting dynamic requirements, while providing thermal decoupling. Other considerations include electrical insulation of a module from its environment.

It is an aspect of the present invention to overcome the problems identified with respect to conventional projection optics assemblies. In particular, it is an aspect of the present invention to improve the positioning accuracy of an optical element and the stability and dynamic performance of a projection optics assembly. A further aspect of the present invention is improve the manufacturability of the projection optics assembly.

According to an aspect of the invention, there is provided a lithographic apparatus that includes an illumination system for providing a beam of radiation, and a support structure for supporting a patterning device. The patterning device serves to impart the beam of radiation with a pattern in its cross-section. The apparatus also includes a substrate table for holding a substrate, and a projection optics assembly for projecting the patterned beam onto a target portion of the substrate. The projection optics assembly includes a plurality of movable optical elements and a plurality of sensor units for sensing the position and/or orientation of a respective optical element. The movable optical elements are arranged in a spaced relationship on a support frame. The support frame includes an assembly of at least two interconnected segments, each of the segments movably mounting at least one of the optical elements and fixedly mounting at least one of the sensor units. The at least two interconnected segments serve as a reference and mounting frame within which the optical elements are mounted in the spaced relationship.

By providing an assembly that includes at least two interconnected segments, each of which movably mount at least one of the optical elements, and fixedly mount one or more respective sensor unit(s), the conventional, separate, reference frame and the elements included in the statically determined interfaces may be dispensed with. In particular, the separate sensor and reference frame structures may be replaced by one structure combining both functions. Thus, the manufacturability of the projection optics assembly may be simplified. In particular, the design and interface complexity may be reduced. Also, individual tolerancing requirements may be reduced. Further, since the support and reference functions are provided by one support frame, the dynamic performance of the projection optics assembly may be improved. The interfacing complexity is reduced as a number of interfaces and interfacing elements are no longer necessary. Further, due to the fact that the number of different parts is decreased, and since a number of interfaces are dispensed with, individual tolerancing may be relaxed.

Further, by dispensing with the separate conventional reference frame, the number of spacers required to manufacture the projection optics assembly may be reduced. Also, the decreased number of construction parts and the associated reduction in the number of interfaces may reduce the number of spacers required. Further, the space previously required for the two separate frames is freed up for other purposes, such as cabling, access and improved stiffness of the supporting frame structure. By constructing the support frame of a plurality of segments, it allows the support frame to be built up in a modular manner without reference or incorporation into a further structure. This increases the accessibility to components once assembled in the projection optics assembly.

Further, manufacturability is improved. For example, with regard to assembly, one segment, containing a (number of) mirror(s) may be accessed from both sides. Mirror(s), sensor, actuator, cabling and possible any other sub-module may be put into, and mounted onto the frame block of the segment, quite separate from and parallel to any other assembly activity, particularly the assembly of the other segments of the projection optics assembly.

In an embodiment, the plurality of segments are adapted to interconnect with one another in a stacked arrangement. By stacking segments on top of one another, the manufacture of the projection optics assembly is simplified. Once all segments are fully assembled and tested, they need to simply be stacked on top of each other to arrive at a fully functional projection optics assembly. In particular, the final assembly is greatly facilitated according to the present invention, providing a decrease in production lead time.

In an embodiment, the support frame includes three segments. At least two of the plurality of optical elements are mounted in at least each of two of the segments. By providing three segments, in two of which two optical elements are disposed, optical element accessibility and cable routing may be optimized while optimizing the mechanical properties of the support frame. Further accessibility of the sensors and actuators and any other module may be improved.

In an embodiment, the support frame includes a plurality of inserts. The inserts are adapted to be disposed between segments to form, in use, an interface zone, so that in an assembled state, the inserts come into contact with one another, in which at least a part of a surface defined by the contacting inserts forms a reference surface. By providing inserts between adjacent segments, and arranging the reference surface to lie within an interface zone formed by the contacting inserts, not only is alignment achieved, any stresses exerted on the support frame in the interface zone may be transferred to the inserts rather than through the support frame.

According to a further aspect of the present invention, there is provided a lithographic apparatus that includes an illumination system for providing a beam of radiation, and a support structure for supporting a patterning device. The patterning device serves to impart the beam of radiation with a pattern in its cross-section. The apparatus also includes a substrate table for holding a substrate, and a projection optics assembly for projecting the patterned beam onto a target portion of the substrate. The projection optics assembly includes a plurality of movable optical elements and a plurality of sensor units for sensing a position and/or orientation of a respective optical element. The movable optical elements are arranged in a spaced relationship on a single support frame. The optical elements are movably mounted and the sensor units are fixedly mounted on the single support frame. The support frame includes one segment which serves as a reference and mounting frame, within which the optical elements are mounted in the spaced relationship. By providing the optical elements movably mounted and the sensor unit fixedly mounted on a single support frame, it is possible to dispense with a separate reference frame. The separate reference and sensor frame structures may be replaced with a single structure combining both functions. By mounting the optical elements and sensor units in a single structure, the manufacture of the assembly may be simplified, and the long term stability and dynamic performance may be improved.

In an embodiment, the sensor unit or sensor units is or are mounted directly in the segment or segments at a predetermined location. By disposing the sensor unit or units directly in the support frame at a predetermined location, the number of distances which are to be known between two optical elements is reduced to one distance between a first sensor unit and a second sensor unit. Thus, the associated error measurement is reduced, which gives an improvement in the positioning accuracy of the optical elements with respect to one another.

In an embodiment, the sensor unit senses the position and/or orientation of the respective optical element with respect to a reference surface located on or in the segment or segments, and the segment or segments is/are provided with an interface surface formed in the segment or segments for receiving the sensor unit. The interface surface is disposed at the predetermined location, which is predetermined with respect to the reference surface. By providing an interface surface at the predetermined location, with respect to a reference surface, the accuracy with which the position and/or orientation of the mirror can be determined may be improved.

In an embodiment, the segment or segments fixedly supports an actuator coupled to the respective one of the plurality of optical elements. The actuator is responsive to a sensor unit for moving the optical element to a predetermined location. By fixedly supporting an actuator coupled to a respective optical element in the segment or segments, all of the components in the projection optics assembly which provide accurate alignment of one optical element with respect to a second optical element are mounted in the segment or segments. This may further simplify the manufacture of the assembly.

In an embodiment, when assembled, the segments interface with each other in a substantially horizontal plane. In this way, the segments are readily assembled and should any maintenance be necessary, they may be readily disassembled, so that the segment requiring maintenance may be removed without requiring the entire projection optics assembly to be disassembled. This may improve the ease of maintenance.

According to a further aspect of the invention, there is provided a method of assembling a projection optics assembly for a lithographic apparatus. The method includes providing a plurality of interconnectable segments, on each segment, movably mounting a plurality of optical elements disposed in a spaced relationship with respect to one another, and fixedly mounting at least one sensing element so as to sense the position and/or orientation of one of the plurality of the movably mounted optical elements, and interconnecting the segments so as to at least partially form a single support frame which serves as a reference and mounting frame within which the optical segmentable elements are mounted in the spaced relationship.

According to a further aspect of the invention, there is provided a method of assembling a projection optics assembly for a lithographic apparatus. The method includes movably mounting a plurality of optical elements on a plurality of interconnectable segments such that each optical element is disposed in a spaced relationship with respect to one another, fixedly mounting at least one sensing element on at least one of the segments so as to sense a position and/or orientation of one of the optical elements, and interconnecting the segments so as to at least partially form a single segmentable support frame which serves as a reference and mounting frame within which the optical elements are mounted in the spaced relationship.

According to a further aspect of the present invention, there is provided a method of assembling a projection optics assembly for a lithographic apparatus. The method includes providing a single support frame including one segment which serves as a reference and mounting frame for a plurality of optical elements disposed in a spaced relationship with respect to one another, and a sensor unit associated with one of the plurality of optical elements, for determining a position and/or orientation of the movable optical elements, and on the frame, movably mounting the plurality of optical elements and fixedly mounting the sensor unit.

According to a further aspect of the present invention, there is provided a method of assembling a projection optics assembly for a lithographic apparatus. The method includes movably mounting a plurality of optical elements in a spaced relationship with respect to one another on a single support frame comprising one segment that serves as a reference and mounting frame, and fixedly mounting a sensor unit associated with one of the plurality of optical elements on the support frame. The sensor unit is configured to determine a position and/or orientation of the optical elements.

According to a further aspect of the present invention, there is provided a device manufacturing method that includes providing a substrate, providing a projection beam of radiation using an illumination system, using a patterning device to impart the projection beam with a pattern in its cross-section, and projecting the patterned beam of radiation onto a target portion of the substrate using a projection optics assembly.

According to a further aspect of the present invention, there is provided a device manufacturing method that includes patterning a beam of radiation with a patterning device, and projecting the patterned beam of radiation onto a target portion of a substrate with a projection optics assembly. The projection optics assembly includes a plurality of movable optical elements and a plurality of sensor units for sensing the position and/or orientation of a respective optical element. The movable optical elements are arranged in a spaced relationship on a support frame. The support frame includes an assembly of at least two interconnected segments. Each of the segments movably mount at least one of the optical elements and fixedly mount at least one of the sensor units. The interconnected segments serve as a reference and mounting frame within which the optical elements are mounted in the spaced relationship.

According to a further aspect of the present invention, there is provided a device manufacturing method that includes patterning a beam of radiation with a patterning device, and projecting the patterned beam of radiation onto a target portion of a substrate with a projection optics assembly. The projection optics assembly includes a plurality of movable optical elements and a plurality of sensor units for sensing a position and/or orientation of a respective optical element. The movable optical elements are arranged in a spaced relationship on a single support frame. The optical elements are movably mounted and the sensor units are fixedly mounted on the support frame. The support frame includes one segment which serves as a reference and mounting frame within which the optical elements are mounted in the spaced relationship.

According to a further aspect of the present invention, a projection optics assembly for a lithographic apparatus is provided. The projection optics assembly includes a plurality of movable optical elements and a plurality of sensor units for sensing a position and/or orientation of a respective optical element. The movable optical elements are arranged in a spaced relationship on a support frame. The support frame includes an assembly of at least two interconnected segments. Each of the segments movably mount at least one of the optical elements and fixedly mount at least one of the sensor units. The at least two interconnected segments serve as a reference and mounting frame within which the optical elements are mounted in the spaced relationship.

According to a further aspect of the present invention, a projection optics assembly for a lithographic apparatus is provided. The projection optics assembly includes a plurality of movable optical elements and a plurality of sensor units for sensing a position and/or orientation of a respective optical element. The movable optical elements are arranged in a spaced relationship on a single support frame. The optical elements are movably mounted and the sensor units are fixedly mounted on the support frame. The support frame includes one segment which serves as a reference and mounting frame within which the optical elements are mounted in the spaced relationship.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in, for example, a track (a tool that typically applies a layer of resist to a substrate and develops the exposed resist), or a metrology or inspection tool. Where applicable, the disclosure herein may be applied to such and other substrate processing tools. Further, the substrate may be processed more than once, for example, in order to create a multi-layer IC, so that the term substrate used herein may also refer to a substrate that already contains multiple processed layers.

The terms "radiation" and "beam" as used herein encompass all types of electromagnetic radiation, including ultra-violet (UV) radiation (e.g. having a wavelength of 365, 248, 193, 157 or 126 nm) and extreme ultra-violet (EUV) radiation (e.g. having a wavelength in the range of 5–20 nm), as well as particle beams, such as ion beams or electron beams.

The term "patterning device" as used herein should be broadly interpreted as referring to a device that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of patterning device, the support structure may be a frame or table, for example, which may be fixed or movable as required and which may ensure that the patterning device is at a desired position, for example, with respect to the projection system. Any use of the terms "reticle" or "mask" herein may be considered synonymous with the more general term "patterning device".

The term "projection system" as used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 4 depicts a detail of the support frame of the projection optics assembly of FIG. 2a.

DETAILED DESCRIPTION

Figure 1:
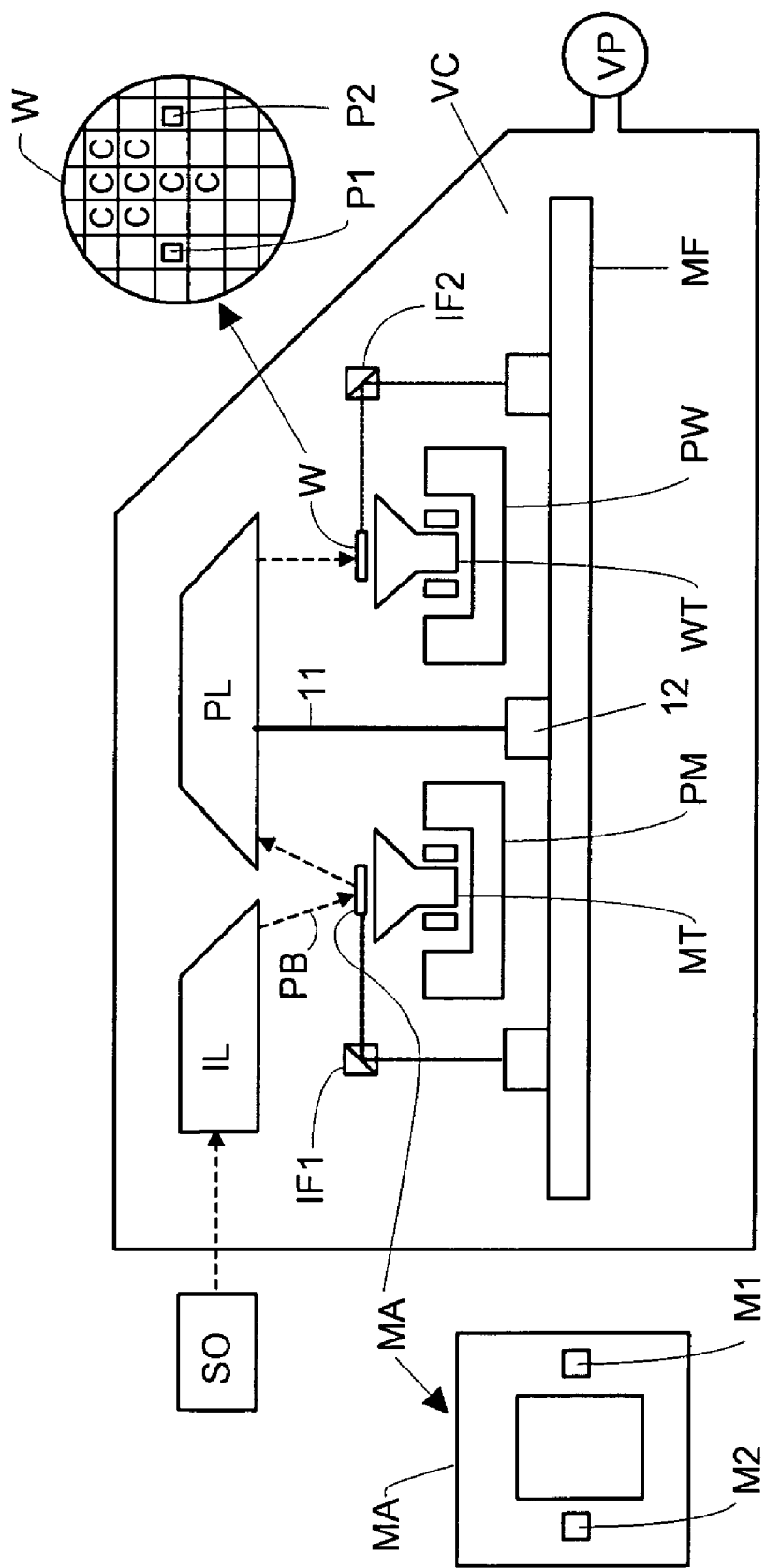
FIG. 1 depicts a lithographic apparatus according to an embodiment of the invention.

FIG. 1 schematically depicts a lithographic apparatus according to a particular embodiment of the invention. The apparatus includes: an illumination system (illuminator) IL for providing a projection beam PB of radiation (e.g. UV or EUV radiation); a first support structure (e.g. a mask table) MT for supporting a patterning device (e.g. a mask) MA and connected to a first positioning device PM for accurately positioning the patterning device MA with respect to item PL; a substrate table (e.g. a wafer table) WT for holding a substrate (e.g. a resist-coated wafer) W and connected to a second positioning device PW for accurately positioning the substrate with respect to item PL; and a projection system (e.g. a reflective projection lens) PL for imaging a pattern imparted to the projection beam PB by the patterning device MA onto a target portion C (e.g. including one or more dies) of the substrate W.

As here depicted, the apparatus is of a reflective type (e.g. employing a reflective mask or a programmable mirror array of a type as referred to above). Alternatively, the apparatus may be of a transmissive type (e.g. employing a transmissive mask).

The illuminator IL receives a beam of radiation from a radiation source SO. The source and the lithographic apparatus may be separate entities, for example, when the source is a plasma discharge source. In such cases, the source is not considered to form part of the lithographic apparatus and the radiation beam is generally passed from the source SO to the illuminator IL with the aid of a radiation collector including, for example, suitable collecting mirrors and/or a spectral purity filter. In other cases, the source may be integral part of the apparatus, for example, when the source is a mercury lamp. The source SO and the illuminator IL, may be referred to as a radiation system.

The illuminator IL may include an adjusting device for adjusting the angular intensity distribution of the beam. Generally, at least the outer and/or inner radial extent (commonly referred to as $\sigma$-outer and $\sigma$-inner, respectively) of the intensity distribution in a pupil plane of the illuminator can be adjusted. The illuminator IL provides a conditioned beam of radiation, referred to as the projection beam PB, having a desired uniformity and intensity distribution in its cross-section.

The projection beam PB is incident on the mask MA, which is held on the mask table MT. Being reflected by the mask MA, the projection beam PB passes through the lens PL, which focuses the beam onto a target portion C of the substrate W. With the aid of the second positioning device PW and position sensor IF2 (e.g. an interferometric device), the substrate table WT can be moved accurately, e.g. so as to position different target portions C in the path of the beam PB. Similarly, the first positioning device PM and position sensor IF1 can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning devices PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

1. In step mode, the mask table MT and the substrate table WT are kept essentially stationary, while an entire pattern imparted to the projection beam is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

The lithographic apparatus of the example shown in FIG. 1 includes a vacuum chamber VC which is evacuated by vacuum pump VP. The beam PB impinges on mask MA and subsequently onto the target area of the substrate W in the vacuum chamber VC.

A so-called "metrology frame" MF provides an isolated frame of reference, which is mechanically isolated from the main apparatus frame. The metrology frame may be realized, for example, as a heavy table supported by airmounts (not shown) that provide a resilient support with a low elastic coefficient. The metrology frame MF supports sensitive components such as the interferometers IF1, IF2, and other position sensors and isolate them from vibration. Projection optics assembly PL is supported on metrology frame MF via a resilient element 12 and a support 11.

Figure 2A:
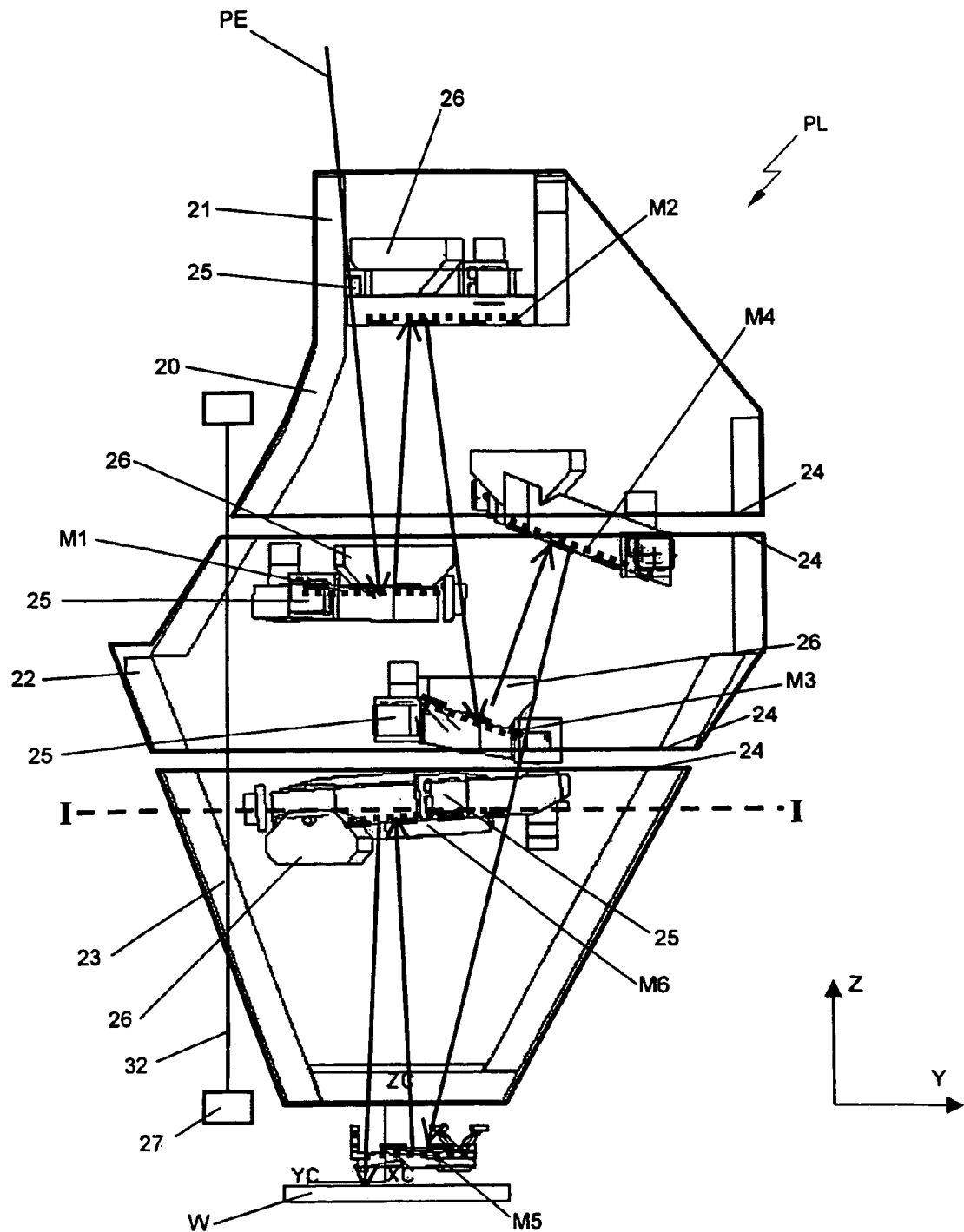
FIG. 2a depicts a projection optics assembly of the apparatus of FIG. 1.
Figure 2B:
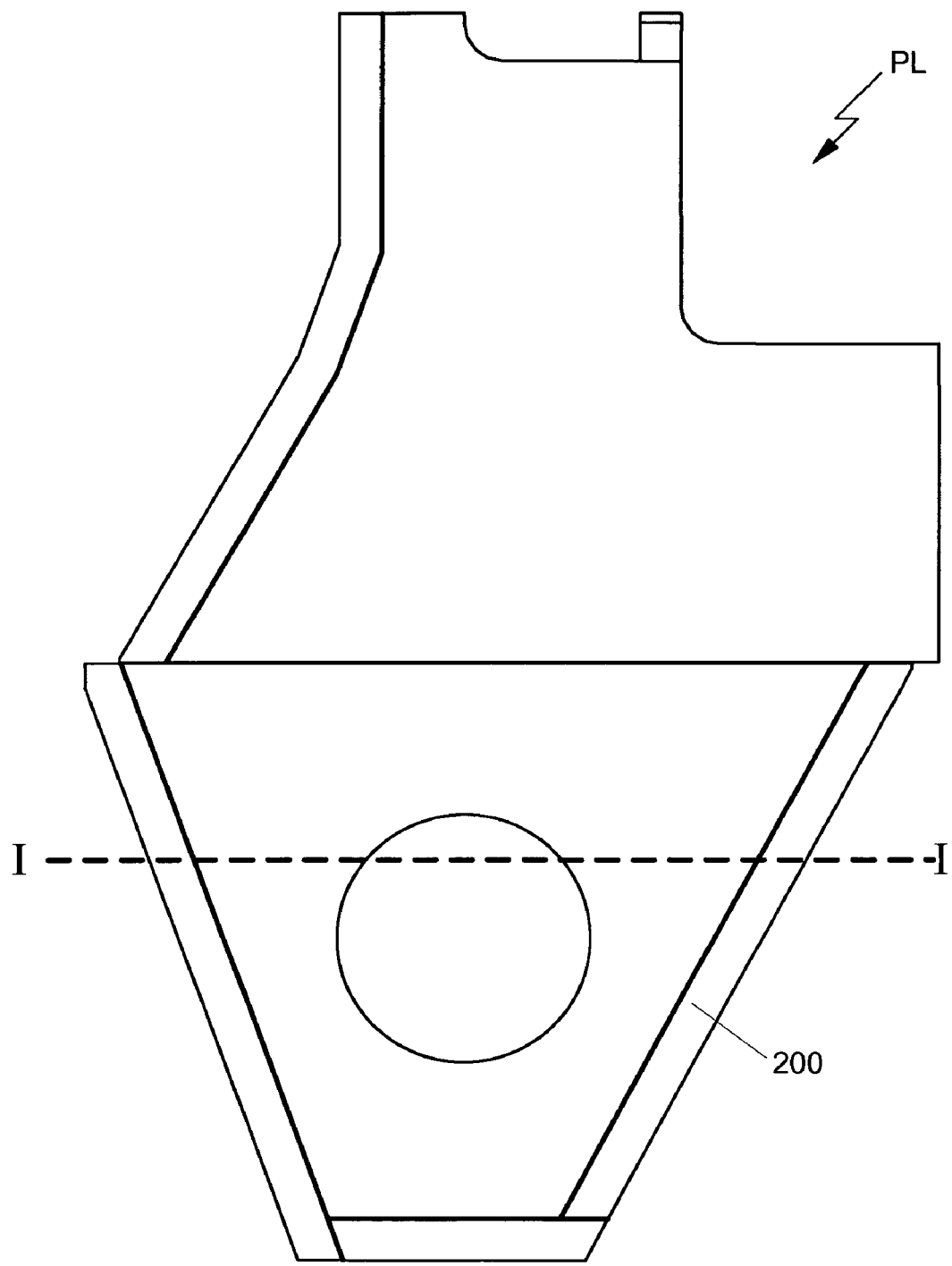
FIG. 2b depicts another projection optics assembly of the apparatus of FIG. 1.

FIG. 2a shows an embodiment of the projection optics assembly PL. In particular, FIG. 2a shows a projection optics assembly PL that includes a support frame 20 that includes a plurality of segments 21, 22, 23. FIG. 2b shows a further embodiment of the present invention, in particular, a projection optics assembly PL that includes a single support frame 200. This is the only difference between the two embodiments shown in FIGS. 2a and 2b. Thus, the description below with respect to FIG. 2a, unless indicated otherwise, applies equally to FIG. 2b. The projection optics assembly PL contains a number of optical elements, preferably optical reflectors, such as optically active mirrors M1–M6 and a support frame 20. The mirrors M1–M6 are arranged to image the mask MA onto the substrate W. The mirrors M1–M6 and the support frame 21 are preferably made of a glass with low expansion coefficient such as ZERODUR® or ULE® (ultra low expansion) glass. As can be appreciated from FIG. 1, the mirrors M1–M6 and the support frame 20 have a support on the metrology frame MF. The support frame 20 is supported via a resilient element 12 to isolate the support frame 20 from vibrations of the metrology frame MF. Although only one resilient element 12 is shown in FIG. 1 for the sake of clarity, it is understood that the support frame 20 may be supported via a number of such elements in parallel.

In the example shown in FIG. 2a, the support frame 20 includes three segments 21, 22 and 23. Each segment contains two mirrors. Typically, mirror M6 is suspended from segment 23. All mirrors, except mirror M5 may be actively positioned using, for example, Lorentz actuators. Since mirror M5 does not have to be actively positioned, it is not provided with sensors and actuators. Mirror M5 is suspended from the segment 23, where it is also fixed to the support frame 20. Construction elements (not shown) are provided to decouple mirror M5 from the surrounding support frame 20, while at the same time suspending it rigidly. As mentioned, above, in an alternative embodiment, mirror M5 is not fixed, but is mounted in the same way as mirrors M1–M4 and M6.

In alternative embodiments, any number of segments may be provided depending on the particular projection optics assembly and the designer's choice. Segments may be constructed to include any number of mirrors, or none at all. The total number of mirrors in the projection optics assembly will vary depending on the particular application of the projection optics assembly.

For embodiments that include a plurality of segments, the segments may be disposed in a stacked arrangement. In one embodiment, they may be simply stacked on top of one another to form the projection optics assembly. Other alternative embodiments are envisaged, where, for example, segments may be placed side by side with one another, or a combination where, for example, some segments of the projection optics assembly are stacked on top of one another and another segment is aligned along side. The invention is not limited in this respect, since each segment can be adapted to interconnect with its adjacent segments. In an embodiment, as shown in FIG. 2b, the projection optics assembly PL may include only one "segment". In such an embodiment, although it is not necessary that the segment interconnects with other segments, interconnecting elements may be provided to connect that segment with others, if required.

Each segment, as shown in FIG. 2a, or single support frame, as shown in FIG. 2b, combines the functionality of providing a reference frame with a mounting frame. The combined functionality means that it is not necessary that individual segments be mounted in a separate reference frame, since all segments or the single support structure 200 are referenced by virtue of the support frame 20 with respect to each other.

In an embodiment, the interface area is formed by a slightly elevated area, which may be formed as a monolithic part of the frame structure. In this particular embodiment, inserts may be dispensed with. As discussed in more detail below, in alternative embodiments, where the frame structure is not formed of ZERODUR®, but of other alternative materials which are less brittle and stronger than ZERODUR®, this embodiment is preferred. When materials, such are ZERODUR® are used, which do have certain brittle qualities, it is advantageous to provide separate inserts.

In order to further decrease frame distortion caused by a change in interface forces, due to thermal or relaxation effects, an additional interface element may optionally be provided to diminish these effects, although from a material properties point of view, such inserts are not necessary. In the case where additional inserts may optionally be included, the design of the interface is such as to absorb the stresses, while keeping the stresses away from the actual support frame.

Generally speaking, depending on material and design, an interface insert may be, by way of example only, a separate part from a different material, connected to the rest of the frame through gluing, bolting, etc., a separate part of the same material, glued, bolted, welded, etc., an integral part of the frame structure, subtly separated from its surroundings by cutting, sawing, drilling, etc. Further, such inserts may optionally be provided, for example only, to perform the function of providing an interface of non brittle material, an interface surface capable of withstanding the surface stresses, a construction capable of withstanding and guiding the reaction forces to the clamping forces, and a construction that keeps clamping induced stresses away from the support frame.

In the embodiments described above, the support frame 20, 200 includes ZERODUR®. However, the invention is not limited in this respect. The present invention is concerned with providing one support frame, either or not segmented, instead of a separate reference frame with a number of separate mirror modules mounted in a statically determined way. As discussed, the present invention provides advantages such as increased simplicity and stability, far less parts, less interfaces, relaxed tolerances, improved dynamic behavior, improved manufacturability, and improved testability. These advantages may also be attained with a support frame included of other ultra low expansion materials, metal materials, such as INVAR®, aluminium, or other ceramic materials.

The segments may be attached to each other by a clamping device 27 (see FIG. 2a) which includes a rod 32, preferably a metal rod threaded at both ends, which extends through holes drilled in the support frame 20, and is attached at one or both ends to a device which exerts a force on the rod 32. The force, which is typically about 13000 Newtons is applied constantly to the rod 32. In FIG. 2a, although for the sake of clarity only one clamping device 27 is shown, the segments are preferably clamped at either three or four relatively large areas. If required, additional fixation elements (not shown) may be provided.

The support frame 20, 200 is constructed of ZERODUR® blocks, tubes, plates and other structures, as appropriate, or from other materials as discussed above, in such a way to achieve sufficient stiffness. Depending on the dynamic requirements, it may be necessary to provide additional elements, such as further ZERODUR® block components, to increase the stiffness of the support frame. It is understood that in order to reduce the effects of any vibrations or shocks on the projection optics assembly, it is necessary that the support frame 20, 200 is sufficiently stiff, both in terms of torsional as well as bending stiffness. The blocks and plate glass structures making up the support frame are connected once, with the intention that they will not be detached again from one another. However, if the need arises, they may be disassembled. The support frame components are connected to each other in a stable manner, for example, by gluing. The finer details of the support frame such as the formation of interface surfaces are machined, for example, by grinding into the support frame, or by providing mounting blocks in the support frame at predetermined locations. In order to provide the clamping device 27, holes are also drilled into the support frame 20.

Each mirror M1–M6, except perhaps for mirror M5, is provided with a sensor unit 25 which detects the position of the mirror with which it is associated and an actuator 26 which in response to the sensor unit moves the mirror to a predetermined location. Typically, sensor information from all sensors is combined in order to control all actuators so to control the six degrees of freedom of the mirror. Thus, one sensor is not generally uniquely associated with one actuator. Since it is necessary to be able to move the mirrors with six degrees of freedom, the sensor units and actuators are the same type as those used in conventional projection optics assemblies. For example, for each mirror M1–M6, except perhaps for mirror M5, which may be held stationary, Lorenz actuator units including the reaction mass and the magnetic gravity compensator are provided. In particular, three actuator units 26 are provided, each containing two actuators at right angles relative to each other. At one end, these units are attached to the mirror itself, and at the other end, and in contrast to conventional projection optics assemblies, each actuator unit is mounted directly in the support frame on an interface surface. Similarly, for each mirror, there are provided three sensor units 25 having an extremely high accuracy. Each sensor unit 25 is capable of measuring two dimensions. Thus, in order to measure all six degrees of freedom, three sensor units 25 are provided. The sensor units 25 are received directly on interface surfaces provided in the support frame 20. Each sensor unit 25 is disposed with respect to a reference surface 24, with relation to which the positioning of one mirror with respect to a second mirror is achieved. In a particular embodiment, the reference surface 24 is located in or on the support frame. In particular, the segments are adapted so as to interface with one another at an interface zone 34, wherein the reference surface includes at least a part of the interface zone 34, and wherein at least one of the segments is provided with the interface surface 24 for receiving a sensor unit 25 and is adapted to accommodate the corresponding mirror.

Figure 3:
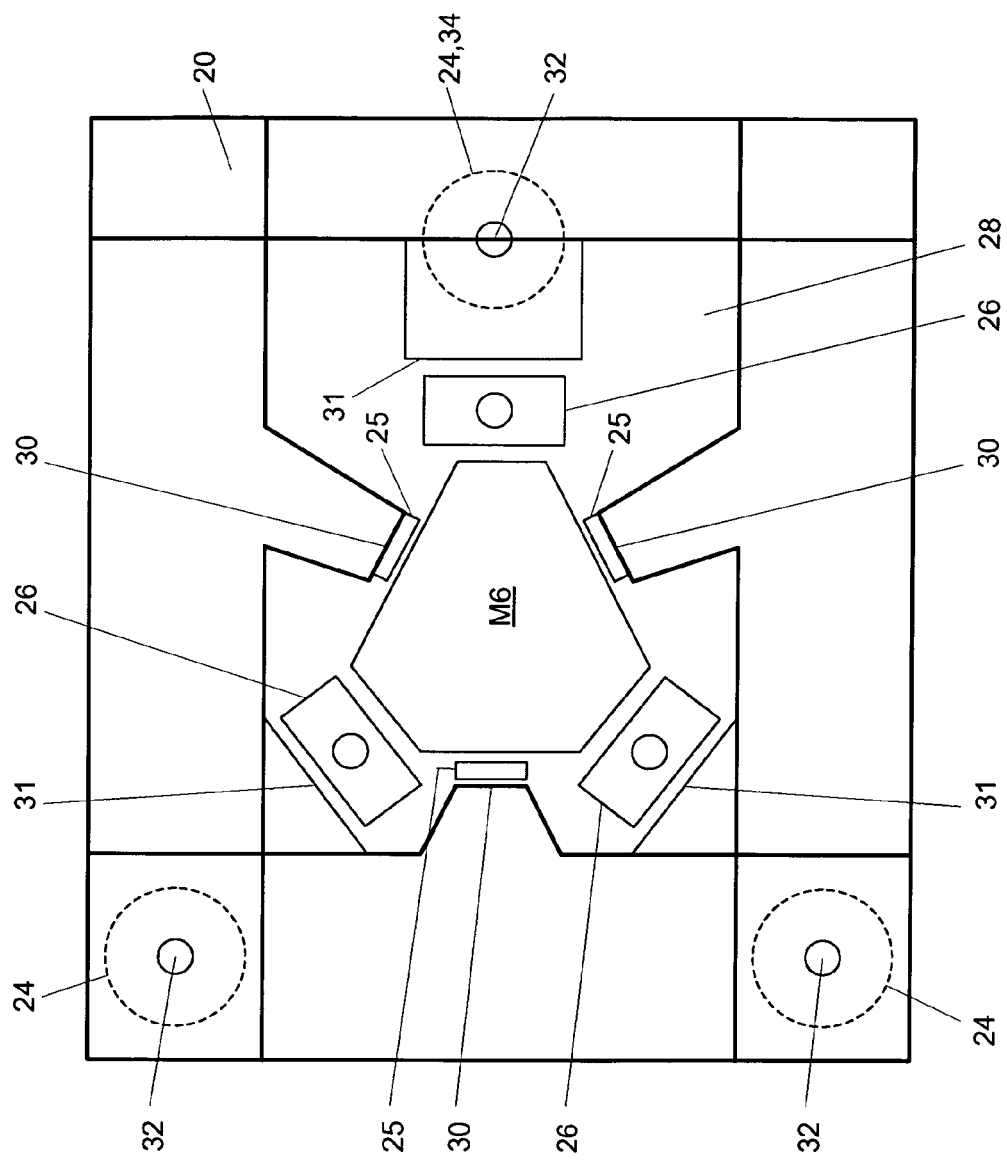
FIG. 3 depicts a cross section of the projection optics assembly depicted in FIG. 2a or 2b through line I—I.

FIG. 3 depicts a cross section of the projection optics assembly depicted in FIG. 2a through line I—I. In the example shown in FIG. 3, the interface zone is shown vertically. The present invention is not limited in this respect, since the angle of the interface zone is not essential to the present invention. Indeed, it may be horizontal or at any other angle. In the example, the mirror M6 is hexagonal. The sensor units 25 and actuators 26 are disposed on alternate sides of the mirror M6. The support frame 20 is provided with interface surfaces 30, 31 for receiving the sensor units 25 and actuators 26, respectively. As mentioned, each sensor unit 25 includes two sensor elements. If necessary, the sensor unit 25 may also include spacers having known dimensions, wherein the spacers are arranged to dispose the sensor elements at a predetermined location. The interface surfaces 30, 31 are formed on or in the support frame 20. In the example shown, blocks of support frame material are arranged to extend into a support frame cavity 28. Also shown are rods 32 extending into the plane of the Figure through the support frame 20, and shown out of the plane of FIG. 3 is the reference surface 24, notionally represented as a circle. It will be understood that the dimensions of the reference surface 24 are not limited and will depend on each application. For example, the reference surface 24 may be constructed of tubes or hollow beams. They may have a square cross section, but are not limited in terms of the construction or the shape.

Figure 4:
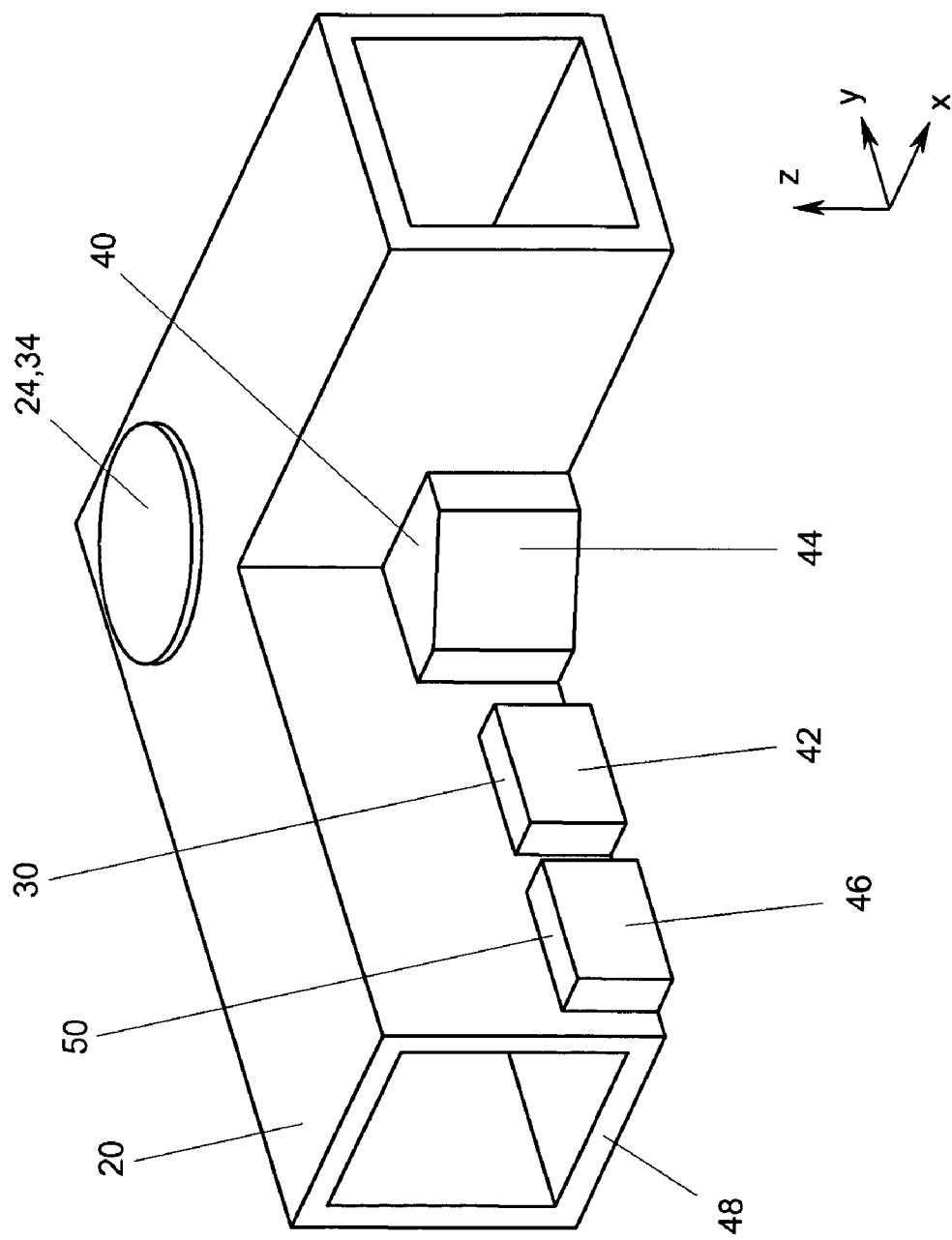

FIG. 4 depicts a detail of the support frame 20 of a projection optics assembly. The support frame 20 includes a frame constructed from tubes, such as hollow beams 48 having a square cross section. Again, the reference surface 24 is notionally shown by circle 24. Provided on the beam 20 are blocks 42, 44 and 46, the upper facing surfaces of which serve as the interface surface 30, 40, 50 for a sensor unit, an actuator, and a mirror, respectively. It will be understood that the shape of the block is not critical and will depend on the particular geometry of each projection optics assembly. The blocks 42, 44, 46 are schematic representations of elements with which the sensor, actuator and mirrors interface. The actual interface may be horizontal, vertical, or at any other angle or orientation. Also, it is not essential that the upper surfaces provide the interface surfaces. In further embodiments, not shown, the interface surfaces may be formed in recesses formed in the support frame 20, or with a combination of recesses and protruding structures. In particular, the support frame segment may be any shape or any form. It is not necessary that it is composed of tubes having any particular cross-section. Parts may be formed from solid material, or parts may be I-, T-, or U-shaped beams. The invention is not limited with respect to the form of particular parts, provided the support frame 20 is stiff enough, provides access, and provides surfaces for all parts, interfaces and measurements required. In a particular embodiment, for example, it may be formed of solid material into which recesses are created to allow for the mirrors, sensors, actuators, cables and any other unit that may be required. Further, the blocks 46 are not essential. The functionality provided by block 46 is to provide a support for the mirror. In particular, block 46 provides a soft support for the mirror, a so-called gravity compensator. This is a unit with a stiffness that is as low as possible, but which is capable of carrying the weight of the mirror. A gravity compensator may be provided in one of two embodiments. In an embodiment, a separate gravity compensator is provided by block 46, which may include, among other things, a spring, a magnetic assembly, or a pneumatic assembly. In this embodiment, the gravity compensator may be provided between the mirror and the support frame 20. Alternatively, an internal gravity compensator is provided, whereby each actuator is equipped with its own gravity compensator, for example, a spring, additional magnets or a pneumatic assembly, or by providing a particular predetermined current through its coil. In this alternative embodiment, block 46 is not necessary.

Figure 5:
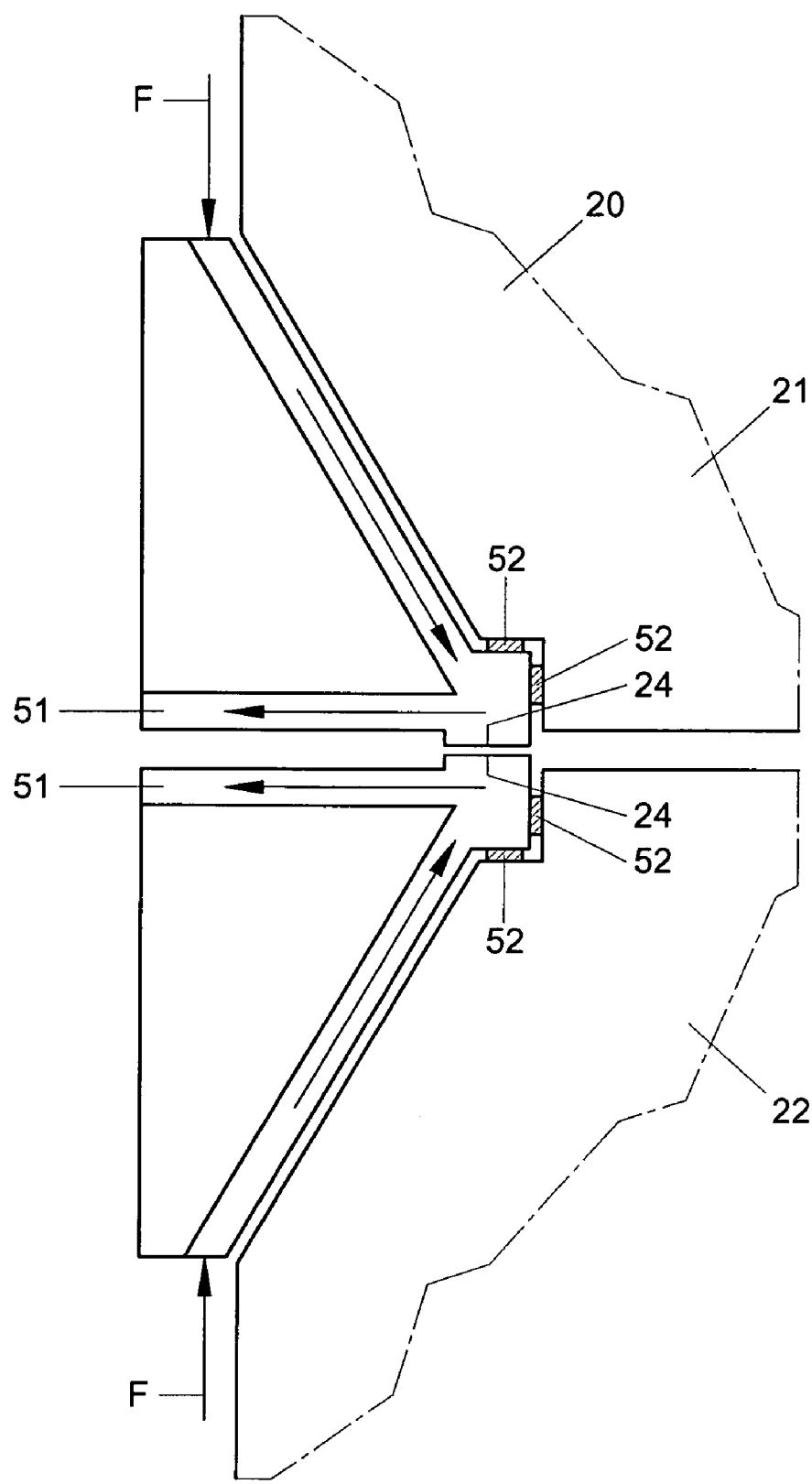
FIG. 5 depicts a further detail of the projection optics assembly of FIG. 4.

FIG. 5 depicts a further detail of a projection optics assembly, in particular, a cross section through an interface between two segments. At least one insert 51, preferably made of a low expansion coefficient material such as INVAR®, is provided. The inserts 51 are provided between adjacent segments 21, 22. The expansion coefficient of INVAR®, although low, is not as low as materials such as ZERODUR®, which is one material for the support frame. Therefore, it is desirable that the dimensions of the inserts 51 be kept as small as possible in order to minimize any possible error introduced into the system due to the thermal expansion of INVAR® over time. With respect to thermal stability, a typical scan for a lithographic apparatus takes approximately five minutes. Thus, it is desirable that the dynamic and thermal stability of the projection optics assembly PL is maintained for a period in the order of five minutes. To join two segments 21, 22, two inserts 51 are provided. One insert 51 interfaces with the first segment 21 and the second insert 51 with the second segment 22. In the assembled arrangement, the inserts 51 are adapted to be disposed between segments to form, in use, an interface zone, so that in an assembled state the inserts 51 come into contact with one another, wherein at least a part of a surface defined by the contacting inserts forms the reference surface. The inserts 51 may be glued with glue 52 to form an integrated frame. The shape and form of the inserts 51 will depend on the particular shape and form of the segments in a region of the interface between the two segments. In the example shown, the inserts 51 are a hollow cone shaped element, wherein the wider base of the cone is enclosed except and the apex of the cone is also provided with a hole, to allow for the threaded metal rod 32 (see FIG. 2a) to provide the clamping force. The cone has a triangular vertical crossectional form, in order to obtain as much surface area contact between the inserts 51 and the support frame 20. The number of inserts 51, that is, the number of interface planes, in a segment may be, for example, three or four. Three inserts are provided in a triangular arrangement, when viewed from above, and as depicted in FIG. 3. When four inserts are used, they are provided in a rectangular arrangement, when viewed from above. The inserts 51 are further adapted so that when a force F, for example, the clamping force is exerted on the insert, that force F is transferred through the insert, rather than being transferred into the support frame 20. This provides the advantage that the support frame material is not subject to any undue stresses which may affect the long term stability of the frame, for example, caused by creep, relation or crack forming. In a worst case, it may even cause a break down of the frame. The properties of INVAR®, which is one of the preferred materials for the inserts, are such that it withstands stress more optimally than ZERODUR® or other glass materials.

While specific embodiments of the invention have been described above, it will be appreciated that the invention may be practiced otherwise than as described. The description is not intended to limit the invention.

What is claimed is:

1. A lithographic apparatus comprising:
   an illumination system for providing a beam of radiation;
   a support structure for supporting a patterning device, the patterning device serving to impart the beam of radiation with a pattern in its cross-section;
   a substrate table for holding a substrate; and
   a projection optics assembly for projecting the patterned beam onto a target portion of the substrate, said projection optics assembly comprising a plurality of movable optical elements and a plurality of sensor units for sensing a position and/or orientation of a respective optical element, said movable optical elements being arranged in a spaced relationship on a support frame, said support frame comprising an assembly of at least two interconnected segments, each of said segments movably mounting at least one of said optical elements and fixedly mounting at least one of said sensor units, wherein said at least two interconnected segments serve as a reference and mounting frame within which said optical elements are mounted in said spaced relationship.

2. A lithographic apparatus according to claim 1, wherein said sensor unit is mounted directly in or on said segment at a predetermined location.

3. A lithographic apparatus according to claim 2, wherein said sensor unit senses the position and/or orientation of said respective optical element with respect to a reference surface located on or in said segment, wherein said segment is provided with an interface surface formed in said segment for receiving said sensor unit, and wherein said interface surface is disposed at said predetermined location, which is predetermined with respect to said reference surface.

4. A lithographic apparatus according to claim 1, wherein said plurality of segments are adapted to interconnect with one another in a stacked arrangement.

5. A lithographic apparatus according to claim 1, wherein said support frame comprises three segments, wherein two of said plurality of optical elements are each mounted in at least two of said segments.

6. A lithographic apparatus according to claim 1, wherein said support frame comprises a plurality of inserts, wherein said inserts are adapted to be disposed between said segments to form, in use, an interface zone, so that in an assembled state said inserts come into contact with one another, wherein at least a part of a surface defined by said contacting inserts forms a reference surface.

7. A lithographic apparatus according to claim 1, wherein said segments fixedly support an actuator coupled to said respective one of said optical elements, said actuator being responsive to one of said sensor units, for moving said optical element to a predetermined location.

8. A lithography apparatus according to claim 1, wherein the segments interface with each other in a substantially horizontal plane.

9. A lithographic apparatus comprising:
an illumination system for providing a beam of radiation;
a support structure for supporting a patterning device, the patterning device serving to impart the beam of radiation with a pattern in its cross-section;
a substrate table for holding a substrate; and
a projection optics assembly for projecting the patterned beam onto a target portion of the substrate, said projection optics assembly comprising a plurality of movable optical elements and a plurality of sensor units for sensing a position and/or orientation of a respective optical element, said movable optical elements being arranged in a spaced relationship on a single support frame, said optical elements being movably mounted and said sensor units being fixedly mounted on the support frame, wherein said support frame comprises one segment which serves as a reference and mounting frame within which said optical elements are mounted in said spaced relationship.

10. A lithographic apparatus according to claim 9, wherein said sensor units are mounted directly in or on said segment at a predetermined location.

11. A lithographic apparatus according to claim 9, wherein said segment fixedly supports an actuator coupled to said respective one of said optical elements, said actuator being responsive to one of said sensor units for moving said optical element to a predetermined location.

12. A method of assembling a projection optics assembly for a lithographic apparatus, the method comprising:
movably mounting a plurality of optical elements on a plurality of interconnectable segments such that each optical element is disposed in a spaced relationship with respect to one another;
fixedly mounting at least one sensing element on at least one of the segments so as to sense a position and/or orientation of one of said optical elements; and
interconnecting said segments so as to at least partially form a single segmentable support frame which serves as a reference and mounting frame within which said optical elements are mounted in said spaced relationship.

13. A method of assembling a projection optics assembly for a lithographic apparatus, the method comprising:
movably mounting a plurality of optical elements in a spaced relationship with respect to one another on a single support frame comprising one segment that serves as a reference and mounting frame; and
fixedly mounting a sensor unit associated with one of said plurality of optical elements on said support frame, said sensor unit being configured to determine a position and/or orientation of said optical elements.

14. A device manufacturing method comprising:
patterning a beam of radiation with a patterning device; and
projecting the patterned beam of radiation onto a target portion of a substrate with a projection optics assembly, said projection optics assembly comprising a plurality of movable optical elements and a plurality of sensor units for sensing the position and/or orientation of a respective optical element, said movable optical elements being arranged in a spaced relationship on a support frame, said support frame comprising an assembly of at least two interconnected segments, each of said segments movably mounting at least one of said optical elements and fixedly mounting at least one of said sensor units, wherein said interconnected segments serve as a reference and mounting frame within which said optical elements are mounted in said spaced relationship.

15. A device manufacturing method comprising:
patterning a beam of radiation with a patterning device; and
projecting the patterned beam of radiation onto a target portion of a substrate with a projection optics assembly, said projection optics assembly comprising a plurality of movable optical elements and a plurality of sensor units for sensing a position and/or orientation of a respective optical element, said movable optical elements being arranged in a spaced relationship on a single support frame, said optical elements being movably mounted and said sensor units being fixedly mounted on the support frame, wherein said support frame comprises one segment which serves as a reference and mounting frame within which said optical elements are mounted in said spaced relationship.

16. A projection optics assembly for a lithographic apparatus, said projection optics assembly comprising a plurality of movable optical elements and a plurality of sensor units for sensing a position and/or orientation of a respective optical element, said movable optical elements being arranged in a spaced relationship on a support frame, said support frame comprising an assembly of at least two interconnected segments, each of said segments movably mounting at least one of said optical elements and fixedly mounting at least one of said sensor units, wherein said at least two interconnected segments serve as a reference and mounting frame within which said optical elements are mounted in said spaced relationship.

17. A projection optics assembly for a lithographic apparatus, said projection optics assembly comprising a plurality of movable optical elements and a plurality of sensor units for sensing a position and/or orientation of a respective optical element, said movable optical elements being arranged in a spaced relationship on a single support frame, said optical elements being movably mounted and said sensor units being fixedly mounted on the support frame, wherein said support frame comprises one segment which serves as a reference and mounting frame within which said optical elements are mounted in said spaced relationship.

* * * * *